(12) United States Patent
Leroy et al.

(10) Patent No.: US 11,899,076 B2
(45) Date of Patent: Feb. 13, 2024

(54) DEVICE FOR AUTOMATIC DETECTION OF COUPLING BETWEEN ELECTRONIC DEVICES

(71) Applicants: Continental Automotive France, Toulouse (FR); Continental Automotive GmbH, Hannover (DE)

(72) Inventors: Yannick Leroy, Toulouse (FR); Jacques Rocher, Toulouse (FR)

(73) Assignees: Continental Automotive France, Toulouse (FR); Continental Automotive GmbH, Hannover (DE)

( * ) Notice: Subject to any disclaimer, the term of this patent is extended or adjusted under 35 U.S.C. 154(b) by 327 days.

(21) Appl. No.: 17/414,118

(22) PCT Filed: Dec. 19, 2019

(86) PCT No.: PCT/EP2019/086219
§ 371 (c)(1),
(2) Date: Jun. 15, 2021

(87) PCT Pub. No.: WO2020/127672
PCT Pub. Date: Jun. 25, 2020

(65) Prior Publication Data
US 2022/0050146 A1 Feb. 17, 2022

(30) Foreign Application Priority Data
Dec. 19, 2018 (FR) ...................................... 1873330

(51) Int. Cl.
*G01R 31/66* (2020.01)
*G01R 31/52* (2020.01)

(52) U.S. Cl.
CPC ............. *G01R 31/66* (2020.01); *G01R 31/52* (2020.01)

(58) Field of Classification Search
CPC ..... G01R 31/343; G01R 31/52; H02P 29/024; H02P 29/028; H02H 7/06; H02H 7/1216; H02H 3/042
See application file for complete search history.

(56) References Cited

U.S. PATENT DOCUMENTS 4,700,304 A * 10/1987 Byrne ..................... B60T 8/885
701/76
8,242,752 B2 * 8/2012 Minkkinen ............. G06F 1/266
710/17
(Continued)

FOREIGN PATENT DOCUMENTS

CN 108732458 A * 11/2018
DE 102012103551 A1 10/2013
WO 2018091830 A1 5/2018

OTHER PUBLICATIONS

English Translation of the Written Opinion for International Application No. PCT/EP2019/086219 dated Mar. 9, 2020, 7 pages.
(Continued)

*Primary Examiner* — Patrick Assouad
*Assistant Examiner* — Demetrius R Pretlow
(74) *Attorney, Agent, or Firm* — RatnerPrestia

(57) ABSTRACT

A computer including a hardware interface wherein the hardware interface includes a first resistor with a first first resistor pin and a second first resistor pin, a second resistor with a first second resistor pin and a second second resistor pin, a transistor, a comparator; the first first resistor pin being coupled on the one hand to the first hardware interface pin and on the other hand to a first transistor pin.

5 Claims, 3 Drawing Sheets

(56) References Cited

U.S. PATENT DOCUMENTS

| | | | |
|---|---|---|---|
| 2005/0270034 A1* | 12/2005 | Tsuchiya | G01R 31/52 |
| | | | 324/509 |
| 2007/0236231 A1* | 10/2007 | Hattori | G01D 5/24 |
| | | | 324/606 |
| 2009/0128099 A1* | 5/2009 | Minkkinen | H02J 9/005 |
| | | | 710/17 |
| 2009/0195205 A1* | 8/2009 | Ide | G01R 31/1227 |
| | | | 318/490 |
| 2011/0075308 A1* | 3/2011 | Yang | G06K 7/0013 |
| | | | 361/87 |
| 2016/0025599 A1* | 1/2016 | Willis | G01M 7/00 |
| | | | 702/190 |
| 2016/0072269 A1 | 3/2016 | Esschendal et al. | |
| 2016/0084867 A1* | 3/2016 | Shafer | G01P 3/489 |
| | | | 324/174 |
| 2016/0097799 A1* | 4/2016 | Rocher | G01L 27/002 |
| | | | 324/537 |
| 2017/0322250 A1* | 11/2017 | Tornare | G01R 31/52 |
| 2018/0301892 A1 | 10/2018 | Gurr et al. | |
| 2019/0252872 A1* | 8/2019 | Rocher | H02H 3/24 |
| 2022/0006414 A1* | 1/2022 | Freire | G01R 31/52 |
| 2022/0026976 A1* | 1/2022 | Stepan | H03K 5/08 |

OTHER PUBLICATIONS

International Search Report and Written Opinion for International Application No. PCT/EP2019/086219, dated Mar. 9, 2020, with partial English translation, 9 pages.

International Search Report and Written Opinion for International Application No. PCT/EP2019/086219, dated Mar. 9, 2020, 13 pages.

* cited by examiner

DEVICE FOR AUTOMATIC DETECTION OF COUPLING BETWEEN ELECTRONIC DEVICES

CROSS REFERENCE TO RELATED APPLICATIONS

This application is the U.S. National Phase Application of PCT International Application No. PCT/EP2019/086219, filed Dec. 19, 2019, which claims priority to French Patent Application No. 1873330, filed Dec. 19, 2018, the contents of such applications being incorporated by reference herein.

FIELD OF THE INVENTION

The present invention relates generally to the coupling of electronic devices. The invention is applicable in particular in the automotive field. It may be implemented, for example, in an electronic computer.

BACKGROUND OF THE INVENTION

A motor vehicle nowadays comprises increasingly more onboard electronics such as, for example, sensors coupled to electronic computers. These onboard electronics require connection technology of greater or lesser complexity in the motor vehicle.

In the case of an internal combustion engine, sensors are used and coupled to at least one electronic computer such as an engine control computer in order to ensure the correct functioning of said internal combustion engine and thus allow better control of fuel consumption and therefore control of the emission of pollutants into the atmosphere.

To produce these sensors, it is known practice in the prior art to use a voltage-source sensor positioned facing a movable notched target. Said sensor generally has three sensor pins for transferring a detection signal in the form of a variation in voltage to the engine control computer.

In recent years, a new sensor technology has been developed—current-source sensors. These sensors deliver information in the form of a variation in current.

Depending on the type of sensor used, there is, at the level of the engine control computer, a different dedicated hardware interface allowing the coupling of said sensor to said engine control computer. This interface makes it possible, among other things, with suitable electronics (in the electronic computer) to generate and receive electrical signals appropriate for managing, in this case, the internal combustion engine.

Thus, when designing the engine control computer, it is necessary to modify its hardware interface according to the type of sensor connected, i.e. a voltage-source sensor or a current-source sensor. Consequently, once the choice of sensor has been made, it is no longer possible to change the type of sensor, for example during the service life of the vehicle, because the hardware interface is not adaptable.

SUMMARY OF THE INVENTION

An aspect of the invention proposes an automatic coupling detection device that provides a partial or full solution to the technical shortcomings of the cited prior art.

To that end, a first aspect of the invention provides a computer comprising a first computer pin, a second computer pin, a third computer pin, a hardware interface comprising a first hardware interface input, a second hardware interface input, a third hardware interface input, which are coupled, respectively, to the first computer pin, to the second computer pin and to the third computer pin, characterized in that the hardware interface comprises a first resistor with a first first resistor pin and a second first resistor pin, a second resistor with a first second resistor pin and a second second resistor pin, a transistor, a comparator; the first first resistor pin being coupled on the one hand to the first hardware interface pin and on the other hand to a first transistor pin; the second first resistor pin being further coupled on the one hand to the first second resistor pin and on the other hand to a second transistor pin, the transistor comprising a third pin; the second second resistor pin being coupled on the one hand to the second hardware interface pin and on the other hand to a second comparator input; the second hardware interface pin being coupled to the first hardware interface output; the comparator further comprising a first input; the first comparator output being coupled to the second hardware interface output.

In another aspect, the invention proposes a method for automatically detecting a sensor coupled to an electronic computer comprising the following steps:

a. First step e1) switching a transistor in order on the one hand to short a first resistor and on the other hand to apply, between a first computer pin and a second computer pin, an impedance of the order of a second resistor resistance, b. Second step e2) reading a signal generated by said sensor coupled to the computer, c. Third step e3) comparing the value of the signal generated by the sensor coupled to the computer with a reference value Vref1, in the case where the result of the comparison is positive, move on to a fourth step e4), and in the case where the result of the comparison is negative, move on to a sixth step e6), d. Fourth step e4) signaling the presence of a fault of short-circuit type at the level of a battery voltage of the sensor, e. Sixth step e6) comparing the value of the signal representative of the sensor coupled to the computer with a reference value Vref2, in the case where the result of the comparison is negative, move on to an eighth step e8), and in the case where the result of the comparison is positive, move on to a fourteenth step e14), f. Eighth step e8) comparing the value of the signal representative of the sensor coupled to the computer with a reference value Vref3, in the case where the result of the comparison is negative, move on to an eleventh step e11), and in the case where the result of the comparison is positive, move on to a ninth step e9), g. Ninth step e9) signaling the presence of a fault of short-circuit type in an electrical ground of the sensor, h. Eleventh step e11) modifying the hardware interface so as to be compatible with a sensor of current-source type, i. Fourteenth step e14) modifying the hardware interface so as to be compatible with a sensor of voltage-source type.

In one exemplary embodiment, the method for automatically detecting a sensor coupled to an electronic computer according to the present invention features, in the eleventh step e11), modifying the hardware interface, which consists in applying, to a first computer pin and to a second computer pin, an impedance of the order of the impedance of a second resistor resistance.

For example, in the eleventh step e11), a signal originating from the sensor of current-source type is processed.

The method for automatically detecting a sensor coupled to an electronic computer may for example feature, in the fourteenth step e14), modifying the hardware interface, which consists in applying, to a first computer pin and to a second computer pin, an impedance of the order of the impedance of the first resistor resistance.

BRIEF DESCRIPTION OF THE DRAWINGS

One preferred exemplary embodiment of the invention will now be described with reference to the accompanying drawings, in which.

DETAILED DESCRIPTION OF THE PREFERRED EMBODIMENTS

Figure 1:
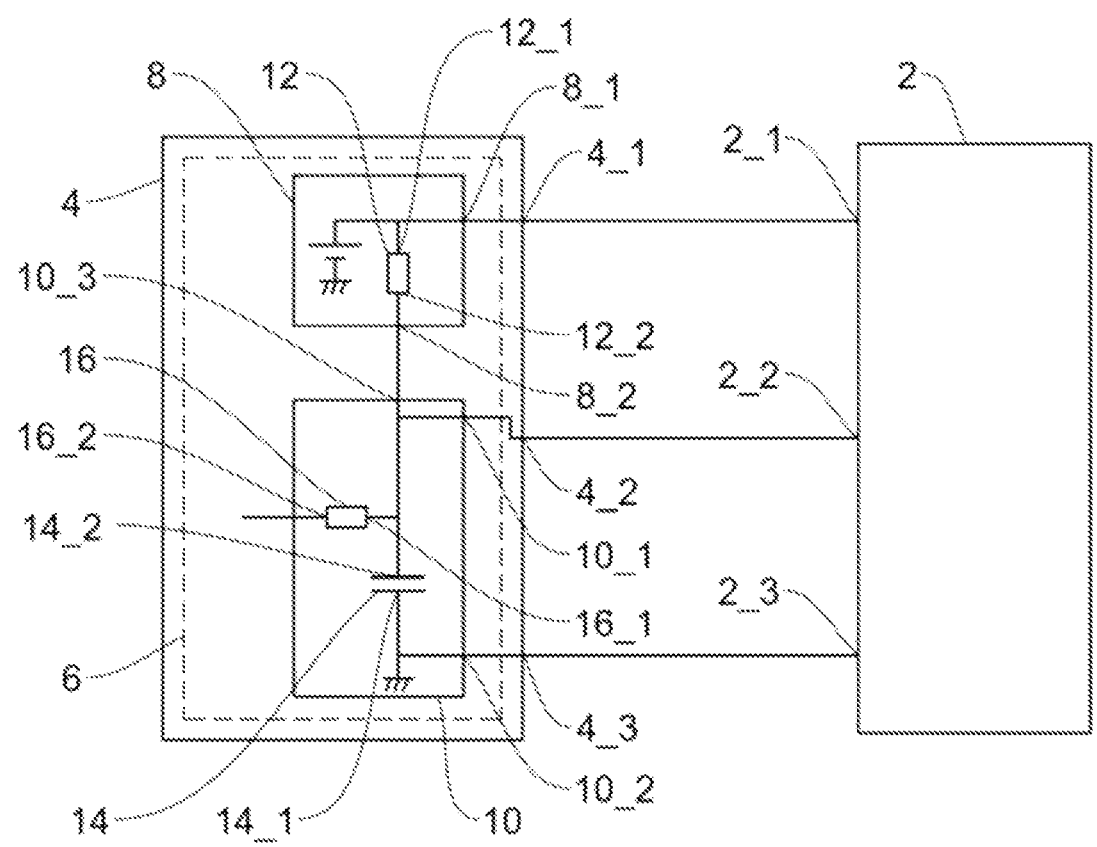
FIG. 1 shows a schematic view of a computer of the prior art coupled to a voltage-source sensor of the prior art.

FIG. 1 illustrates a voltage-source sensor 2 of the prior art coupled for example to an engine control computer 4 of the prior art. The voltage-source sensor 2 is for example a sensor dedicated to detecting the positioning of a camshaft of an internal combustion engine through the passage of teeth of said target in front of said voltage-source sensor 2. Such a voltage-source sensor 2 generally comprises three pins with a first sensor pin 2_1 coupled, for example, to a first computer pin 4_1 and suitable for supplying said voltage-source sensor 2 with electrical power; a second sensor pin 2_2 coupled to a second computer pin 4_2 dedicated to receiving a signal representative of the position of the camshaft; and finally a third sensor pin 2_3 coupled to a third computer pin 4_3 which is generally coupled to an electrical ground of the motor vehicle. The internal structure of the voltage-source sensor 2 is well known to those skilled in the art; it will not be presented in detail here.

The engine control computer 4 has a hardware interface 6 comprising for example a sensor power-supply module 8 and a signal processing module 10.

The sensor power-supply module 8 is suitable for supplying electrical power to the voltage-source sensor 2. To that end, it has a first sensor power-supply module pin 8_1 suitable for delivering said electrical power supply to said voltage-source sensor 2 through the first computer pin 4_1. For example, the electrical power supply has a value of 5 V. The internal structure of the sensor power-supply module 8 is well known to those skilled in the art and many variants are available to them.

In one exemplary embodiment, the sensor power-supply module 8 comprises an electrical power supply that may be a power supply internal to the engine control computer 4 and a "pull-up" resistor 12. Said pull-up resistor 12 has the role of biasing the voltage-source sensor 2. The pull-up resistor 12 has a first resistor pin 12_1 coupled on the one hand to the electric power supply and on the other hand to the first sensor power-supply module pin 8_1. It further comprises a second resistor pin 12_2 coupled to a second electric-power-supply module pin 8_2.

The signal processing module 10 is suitable for shaping and/or filtering a signal originating from the voltage-source sensor 2. To that end, the signal processing module 10 comprises a first signal processing module pin 10_1, a second signal processing module pin 10_2 and a third signal processing module pin 10_3.

For example, the first signal processing module pin 10_1 is coupled to the second computer pin 4_2 and also to the third signal processing module pin 10_3. The second signal processing module pin 10_2 is coupled to the third computer pin 4_3 and the third signal processing module pin 10_3 is coupled to the second electric-power-supply module pin 8_2. A fourth signal processing module pin 10_4 is suitable for delivering a filtered signal to at least one other function of the engine control computer 4.

Additionally, the internal structure of the signal processing module 10 may comprise a first capacitor 14 having a first first capacitor pin 14_1 and a second first capacitor pin 14_2. The second first capacitor pin 14_2 is coupled to electrical ground and the first first capacitor pin 14_1 is coupled on the one hand to a first resistor pin 16_1 and on the other hand to the third signal processing module pin 10_3. Additionally, the third pin 10_3 is coupled to the first pin 10_1. The signal processing module 10 additionally has a resistor 16 having a second resistor pin 16_2. The second resistor pin 16_2 is coupled to the fourth signal processing module pin 10_4. The values of the various elements, such as the resistor resistances and the capacitor capacitance, are well known to those skilled in the art and are therefore not given here.

Figure 2:
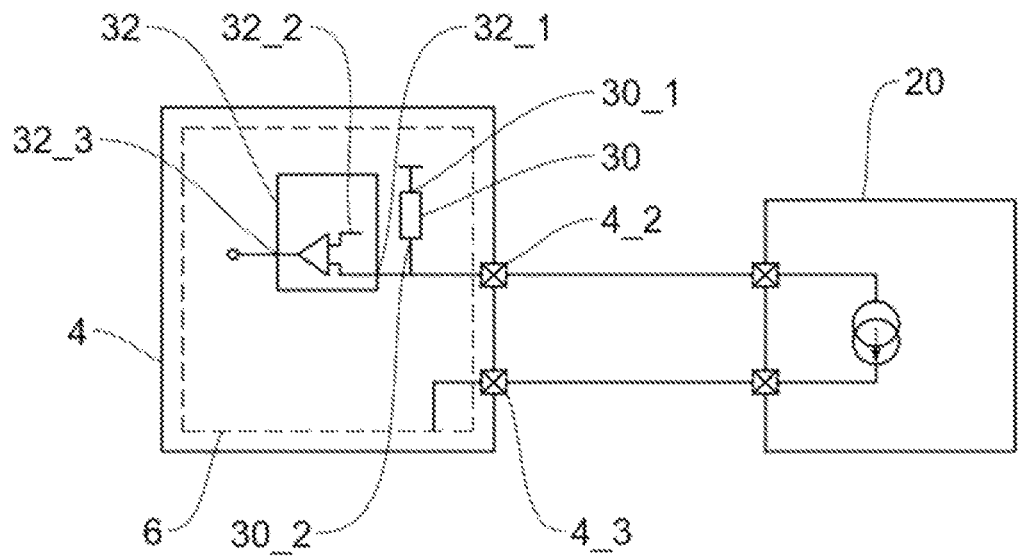
FIG. 2 shows a schematic view of a computer of the prior art coupled to a current-source sensor of the prior art.

FIG. 2 shows an example of a current-source sensor 20 of the prior art. This current-source sensor 20 functions and is coupled to the engine control computer 4. The current-source sensor 20 delivers information in the form of a current variation requiring a different hardware interface 6 at the level of the engine control computer 4 in order to be able to detect close current levels originating from the current-source sensor 20.

To that end, a resistor 30 known by those skilled in the art as a shunt resistor may be used, comprising a first resistor pin 30_1 and a second resistor pin 30_2. The first resistor pin 30_1 is coupled to the electrical power supply of said engine control computer 4, the second resistor pin 30_2 is coupled on the one hand to the second computer pin 4_2 and on the other hand to a first conversion device pin 32_1. The conversion device 32 is suitable for comparing and matching the voltage applied to the second resistor pin 30_2 and the reference voltage applied to the second conversion device pin 32_2.

The conversion device 32 additionally has a second conversion device pin 32_2 coupled to a reference voltage. The value of the reference voltage may for example be 4.5 V. Additionally, the conversion device 32 has a third conversion device pin 32_3 coupled to internal functions of the engine control computer 4. The latter is therefore suitable for generating an electrical signal in the form of at least two voltage levels that are representative of the current flowing through the shunt resistor 30. Preferably, the shunt resistor 30 has a relatively low value of the order for example of 10 ohms.

As mentioned above in the text of the description, for each type of sensor 2, 20, it is therefore necessary, upstream, to modify the internal structure of the hardware interface 6.

Figure 3:
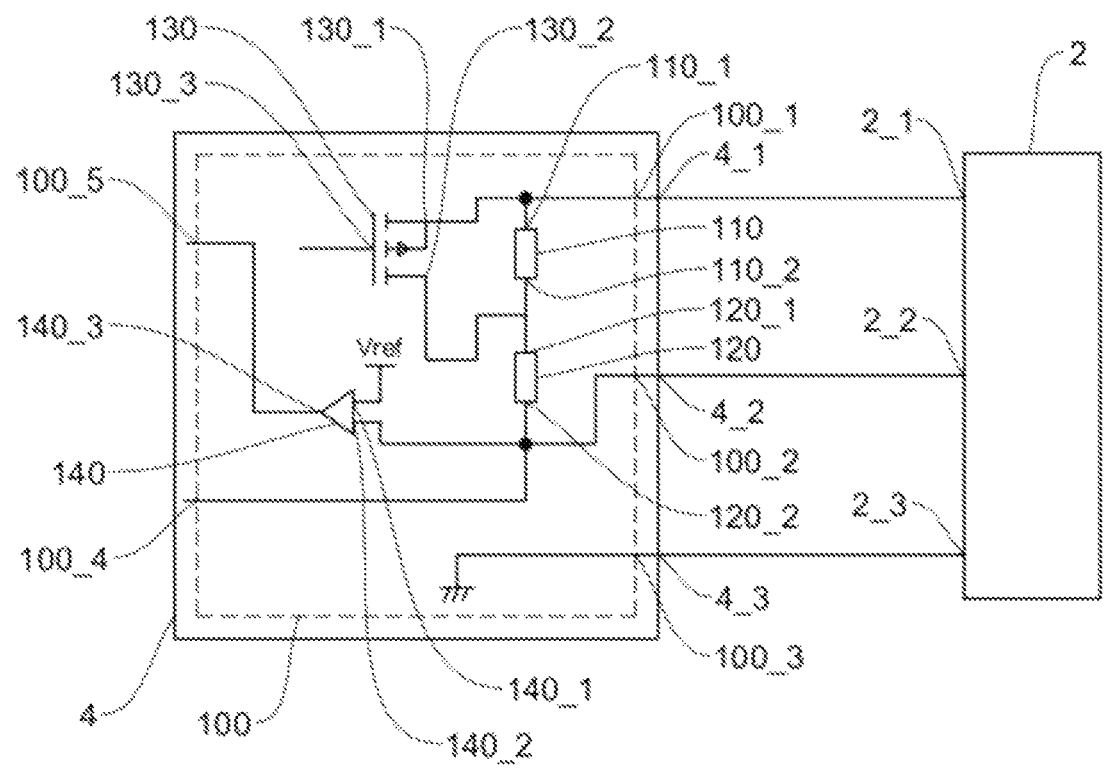
FIG. 3 shows a schematic view of a computer comprising a hardware interface according to an aspect of the invention.

An aspect of the invention proposes, as illustrated in FIG. 3, a novel hardware interface 100 allowing the coupling either of a voltage-source sensor 2 or of a current-source sensor 20 without modifying the internal structure of the hardware interface 100 upstream.

To that end, ingeniously, what is proposed is a hardware interface 100 that is suitable for connecting, to the engine control computer 4, either a voltage-source sensor 2 or a current-source sensor 20 without any need to modify the hardware interface 100 of said engine control computer 4.

In one preferred embodiment, the hardware interface 100 comprises a first hardware interface input 100_1, a second hardware interface input 100_2, a third hardware interface input 100_3 which are coupled, respectively, to the first computer pin 4_1, to the second computer pin 4_2 and to the third computer pin 4_3. The hardware interface 100 further comprises a first hardware interface output 100_4 and a second hardware interface output 100_5, which are coupled to devices internal and/or external to the engine control computer 4.

The hardware interface 100 comprises a first resistor 110, a second resistor 120, a transistor 130, and a comparator 140. The first resistor 110 has a first first resistor pin 110_1 and a second first resistor pin 110_2; the second resistor 120 has a first second resistor pin 120_1 and a second second resistor pin 120_2. The first first resistor pin 110_1 is coupled on the one hand to the first hardware interface pin 100_1 and on the other hand to a first transistor pin 130_1. The second first resistor pin 110_2 is coupled on the one hand to the first second resistor pin 120_1 and on the other hand to a second transistor pin 130_2. In addition, the transistor 130 comprises a third transistor pin 130_3 corresponding, in the case of a MOS (metal-oxide-semiconductor) transistor 130, to the gate as known to those skilled in the art.

The second second resistor pin 120_2 is coupled on the one hand to the second hardware interface pin 100_2 and on the other hand to a second comparator input 140_2. In addition, the second hardware interface pin 100_2 is coupled to the first hardware interface output 100_4.

The comparator 140 additionally comprises a first input 140_1 coupled to a reference voltage which may have, in one exemplary embodiment, a value of 4.5 V. The first comparator output 140_3 is coupled to the second hardware interface output 100_5. The third hardware interface input 100_3 is coupled to a ground of the motor vehicle.

Thus, by virtue of the hardware interface 100 according to an aspect of the invention and more precisely by virtue of the combination of the coupling of the first resistor 110, of the second resistor 120 and of the transistor 130, it is possible to select a low impedance value corresponding to the value of the second resistor 120 or a high impedance value corresponding to the value of the first resistor 110 added to the value of the second resistor 120 between the first hardware interface pin 100_1 and the second hardware interface pin 100_2. What is understood by low impedance value is a value of the order of ten ohms and by high impedance value a value of the order of a thousand ohms.

As mentioned above in the text of the description, either a voltage-source sensor 2 or a current-source sensor 20 is coupled to the first computer pin 4_1, to the second computer pin 4_2 and to the third computer pin 4_3.

Figure 4:
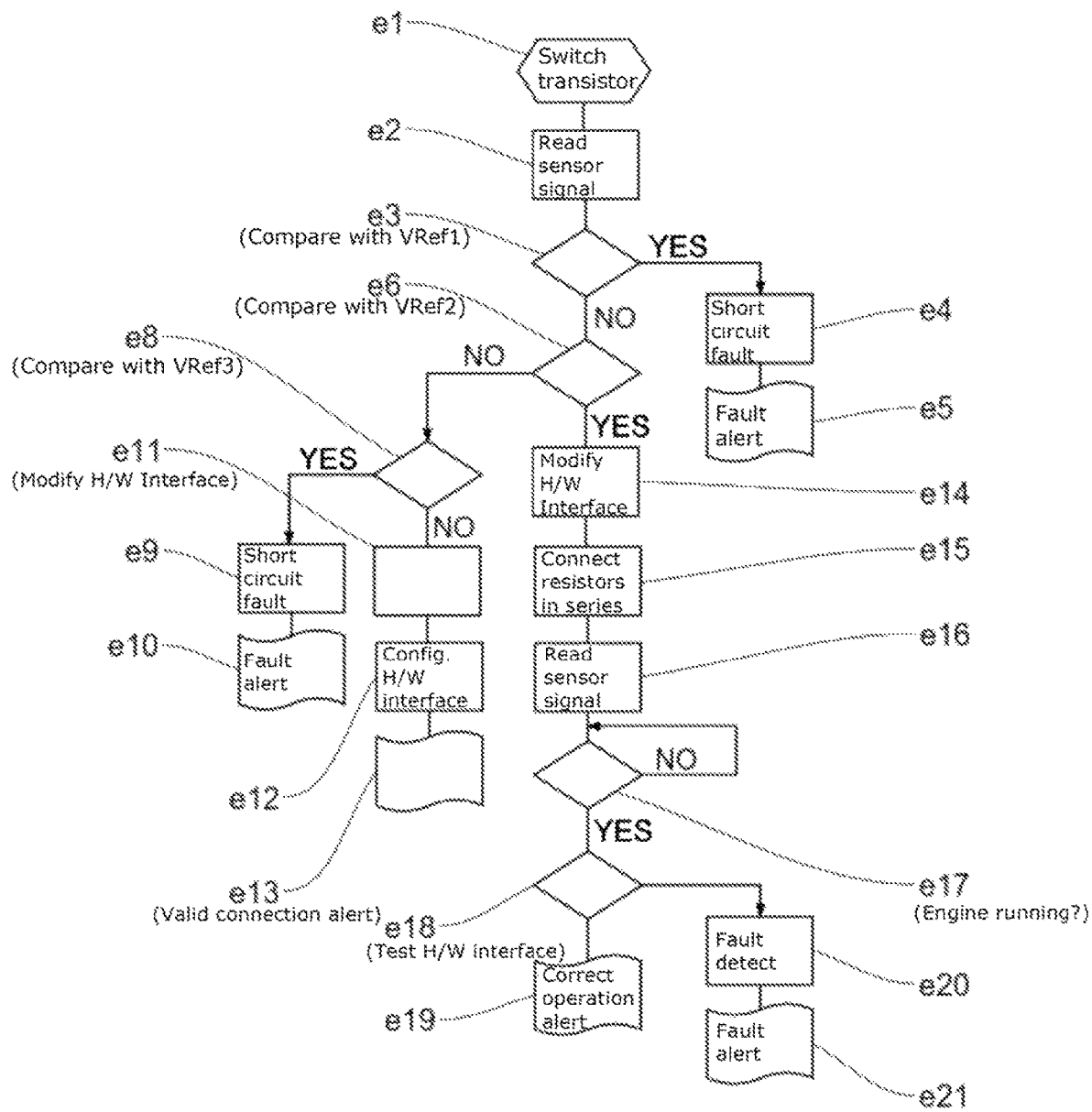
FIG. 4 shows a flowchart of the method according to an aspect of the present invention.

An aspect of the invention additionally provides a method as shown in FIG. 4 for controlling the hardware interface 100 which automatically allows the type of sensor 2 or 20 coupled to the engine control computer 4 to be detected.

The method according to an aspect of the present invention has a first step e1 consisting in switching the transistor 130 to a closed state allowing the first resistor 110 to be shorted. Thus, in this first step e1, an impedance equivalent to the impedance of the second resistor 120 is applied between the first computer pin 4_1 and the second computer pin 4_2. The transistor 130 is controlled by a control signal applied to the third pin 130_3 of said transistor. Such a control signal is well known to those skilled in the art and it will therefore not be discussed or explained further.

In a second step e2, a signal present on the first hardware interface output 100_4 is read which is representative of an input voltage of the sensor 2 coupled to the engine control computer 4. The second step e2 may be performed by a module internal to the engine control computer 4 which will not be presented here because it is unnecessary for the understanding of the method of an aspect of the invention. Once the signal present on the first output 100_4 of the hardware interface has been read, a third step e3 is then performed.

In the third step e3, the value of the signal present on the first hardware interface output 100_4 is compared with a reference value Vref1. For example, the reference value is Vref1=6 V. In the case where the result of the comparison is positive, the method makes provision to move on to a fourth step e4, and in the case where the result of the comparison is negative, to move on to a sixth step e6. In one exemplary embodiment, the comparison of the value of the signal present on the first output 100_4 is performed by a module external to the hardware interface 100.

According to the method of an aspect of the invention, in the case where the result of the comparison is positive (third step e3) this indicates, according to the fourth step e4, the presence of a battery short circuit at the level of the sensor 2, 20 coupled to the engine control computer 4. This fault may for example be detected when the sensor 2, 20 is faulty. The method of an aspect of the invention makes provision, in a fifth step e5 in this scenario, for the delivery of a software alert allowing for example the engine control computer 4 to be informed of such a fault at the level of sensor 2, 20.

According to the method of an aspect of the invention, in the sixth step e6, another comparison of the value of the signal present on the first output 100_4 with a reference value Vref2 is made. For example, the reference value is Vref2=4.7 V. In the case where the result of the comparison is negative, the method makes provision to move on to an eighth step e8, and in the case where the result of the comparison is positive, to move on to a fourteenth step e14.

According to the method of an aspect of the invention, in the eighth step e8, a comparison of the value of the signal present on the first output 100_4 with a reference value Vref3 is made. For example, the reference value is Vref3=1 V. In the case where the result of the comparison is negative, the method makes provision to move on to an eleventh step e11, and in the case where the result of the comparison is positive, to move on to a ninth step e9.

In the case where the result of the comparison is positive (eighth step e8), this indicates, according to the method of an aspect of the invention, the presence of an electrical ground short circuit at the level of the sensor 2, 20 coupled to the engine control computer 4. This fault may for example be detected when the sensor 2, 20 is defective. The method of an aspect of the invention then makes provision, in a tenth step e10, for the delivery of a software alert allowing for example the engine control computer 4 to be informed of such a fault at the level of sensor 2, 20.

In the case where the result of the comparison is negative (eighth step e8), this indicates, according to the method of an aspect of the invention and its eleventh step e11, the presence of a current-source sensor 20 at the terminals of the engine control computer 4.

In a twelfth step e12, a software configuration of the hardware interface 100 is performed so that the impedance across the terminals of the engine control computer 4 which are coupled to the sensor 20 has a low value corresponding to the coupling of a current-source sensor 20. To that end, in the twelfth step e12, the transistor 130 is controlled in order to short the first resistor 110 so that only the impedance of the second resistor 120 is applied between the first pin 100_1 and the second pin 100_2. Thus, the impedance between the first pin 100_1 and the second pin 100_2 is of the order of 10 ohms. Thus, by virtue of the method of an aspect of the invention, it is possible to modify the hardware interface 100 in a software manner when a current-source sensor 20 is detected at the terminals of the hardware interface 100.

The method then makes provision to move on to a thirteenth step e13 during which, for example, information corresponding to the detection and valid connection of a current-source sensor 20 and also information corresponding to the measurement of signals delivered by the second output 100_5 of the hardware interface is sent to a dedicated module of the engine control computer 4.

In the fourteenth step e14, according to the method of an aspect of the invention, the presence of a voltage-source sensor 2 is detected at the terminals of the engine control computer 4. Information on such a presence is for example sent by a dedicated signal to a module of the engine control computer 4.

Next, when moving on to a fifteenth step e15, the transistor 130 is controlled in order to place the first resistor 110 and the second resistor 120 in series. To that end, the method of an aspect of the invention makes provision for controlling the transistor 130 so that it exhibits the behavior of an open switch. Those skilled in the art will understand the form and type of signal to be applied to the transistor 130 and it will therefore not be discussed further here.

Next, in a sixteenth step e16, a software configuration of the hardware interface 100 is performed in order to allow the signals delivered by the voltage-source sensor 2 to be read.

In a seventeenth step e17, it is tested whether the engine is running. To that end, the signal present on the second hardware interface output 100_5 is analyzed. In the case where, for example, pulses appear in said signal, then this indicates that the internal combustion engine is running and the method then makes provision to move on to an eighteenth step e18. Of course, conversely, if no pulse is present, then this indicates, according to the method of an aspect of the invention, that the engine is at standstill and the method then makes provision to return to the seventeenth step e17.

In the eighteenth step e18, the signal present on the second hardware interface output 100_5 is tested. In the case where pulses are present, the method makes provision to move on to a nineteenth step e19, synonymous with correct operation of the voltage-source sensor 2. In the case where no pulse is present, the method makes provision to move on to a twentieth step e20.

In the nineteenth step e19, the method of an aspect of the invention makes provision for the delivery of information to at least one other module of the engine control computer 4, synonymous with the presence and correct operation of the voltage-source sensor 2. The control signals and also the signals generated by the voltage-source sensor 2 are processed in order to detect the state of rotation of the internal combustion engine, for example.

In the twentieth step e20, synonymous with the absence of a pulse in the signal present on the second hardware interface output 100_5, according to the method of an aspect of the invention, a fault is detected on the pins of the engine control computer 4 at the level of the voltage-source sensor 2, which fault therefore corresponds to an open circuit. A twenty-first step e21 is then initiated.

In the twenty-first step, for example, information on the open-circuit fault at the level of the voltage-source sensor 2 is generated, invalidation is generated and sent to modules of the engine control computer 4 for processing and decision-making.

By virtue of an aspect of the invention, it is now possible to detect the presence of a voltage-source and/or current-source sensor at the terminals of an engine control computer automatically. In addition, it is now possible to change the type of sensor during the service life of the engine control computer without changing the latter depending on the type of sensor.

The electronic circuits of the hardware interface are given by way of illustration and are in no way limiting with regard to the scope of an aspect of the invention. Regarding the sequencing of the steps of the method of an aspect of the invention and the number thereof, they are also given by way of illustration and those skilled in the art will be able to modify them as required in order to achieve the same result.

The invention claimed is:

1. A computer comprising:
   a first computer pin,
   a second computer pin,
   a third computer pin, and
   a hardware interface comprising:
   a first hardware interface input, a second hardware interface input, a third hardware interface input, which are coupled, respectively, to the first computer pin, to the second computer pin and to the third computer pin,
   the hardware interface further comprising:
   a first resistor with a first first resistor pin and a second first resistor pin,
   a second resistor with a first second resistor pin and a second second resistor pin,
   a transistor, and
   a comparator;
   the first first resistor pin being coupled on the one hand to the first hardware interface pin and on the other hand to a first transistor pin;
   the second first resistor pin being further coupled on the one hand to the first second resistor pin and on the other hand to a second transistor pin;
   the transistor comprising a third pin;
   the second second resistor pin being coupled on the one hand to the second hardware interface pin and on the other hand to a second comparator input;
   the second hardware interface pin being coupled to the first hardware interface output;
   the comparator further comprising a first input; and
   the first comparator output being coupled to the second hardware interface output.

2. A method for automatically detecting a sensor coupled to the computer as claimed in claim 1, comprising:
   a. a first step e1) switching the transistor in order on the one hand to short the first resistor and on the other hand to apply, between the first computer pin and the second computer pin, an impedance of the order of a resistance of the second resistor,
   b. a second step e2) reading a signal generated by said sensor coupled to the computer,
   c. Third a third step e3) comparing a value of the signal generated by the sensor coupled to the computer with a reference value Vref1, in the case where the result of the comparison is positive, move on to a fourth step e4), and in the case where the result of the comparison is negative, move on to a sixth step e6), d. a fourth step e4) signaling the presence of a short-circuit type fault at a level of a battery voltage of the sensor,
e. a sixth step e6) comparing the value of the signal representative of the sensor coupled to the computer with a reference value Vref2, in the case where the result of the comparison is negative, move on to an eighth step e8), and in the case where the result of the comparison is positive, move on to a fourteenth step e14),
f. an eight step e8) comparing the value of the signal representative of the sensor coupled to the computer with a reference value Vref3, in the case where the result of the comparison is negative, move on to an eleventh step e11), and in the case where the result of the comparison is positive, move on to a ninth step e9),
g. a ninth step e9) signaling the presence of a short-circuit type fault in an electrical ground of the sensor,
h. an eleventh step e11) modifying the hardware interface so as to be compatible with a current-source type sensor, and
i. a fourteenth step e14) modifying the hardware interface so as to be compatible with a voltage-source type sensor.

3. The method for automatically detecting the sensor coupled to the computer as claimed in claim 2, wherein, in the eleventh step e11), modifying the hardware interface comprises applying, to the first computer pin and to the second computer pin, an impedance of the order of the impedance of the second resistor resistance.

4. The method for automatically detecting the sensor coupled to the computer as claimed in claim 2, wherein, in the eleventh step e11), a signal originating from the current-source type sensor is processed.

5. The method for automatically detecting the sensor coupled to the computer as claimed in claim 4, wherein, in the fourteenth step e14), modifying the hardware interface comprises in applying, to the first computer pin and to the second computer pin, an impedance of the order of the impedance of the first resistor resistance.

* * * * *

UNITED STATES PATENT AND TRADEMARK OFFICE
CERTIFICATE OF CORRECTION

Page 1 of 1

PATENT NO. : 11,899,076 B2
APPLICATION NO. : 17/414118
DATED : February 13, 2024
INVENTOR(S) : Yannick Leroy and Jacques Rocher It is certified that error appears in the above-identified patent and that said Letters Patent is hereby corrected as shown below:

In the Claims

In Column 8, Claim 2, Line 62, "Third a third step" should be -- a third step --.

Signed and Sealed this
Twenty-third Day of July, 2024

Katherine Kelly Vidal
*Director of the United States Patent and Trademark Office*